United States Patent
Castro Serrato (10) Patent No.: US 10,041,979 B2
(45) Date of Patent: Aug. 7, 2018

(54) METHOD OF SENSING CURRENT FLOWING IN A POWER MODULE

(71) Applicant: Infineon Technologies AG, Neubiberg (DE)

(72) Inventor: Carlos Castro Serrato, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/585,205

(22) Filed: May 3, 2017

(65) Prior Publication Data

US 2017/0234911 A1  Aug. 17, 2017

Related U.S. Application Data

(62) Division of application No. 13/886,352, filed on May 3, 2013, now Pat. No. 9,678,173.

(51) Int. Cl.
*G01R 33/02* (2006.01)
*G01R 15/20* (2006.01)
(Continued)

(52) U.S. Cl.
CPC ....... *G01R 15/202* (2013.01); *G01R 19/0092* (2013.01); *H01L 23/40* (2013.01);
(Continued)

(58) Field of Classification Search
CPC .... G01N 27/90; G01R 15/20; G01R 33/0283; G01R 33/38; G11C 19/085; H01F 7/0273
(Continued)

(56) References Cited

U.S. PATENT DOCUMENTS 5,833,824 A * 11/1998 Benton ................ G01N 27/414
204/416
6,819,095 B1   11/2004 Dubhashi et al.
(Continued)

FOREIGN PATENT DOCUMENTS

| CN | 1460184 A | 12/2003 |
|---|---|---|
| JP | 2006038640 A | 2/2006 |
| JP | 2006140217 A | 6/2006 |

OTHER PUBLICATIONS

Schrieber-Prillwitz, et al., "Architecture of an Integrated AMR Current Sensor (IACS) System for a Wide Range of Automotive Applications", SENSOR+TEST Conferences 2011, SENSOR Proceedings, 2011, pp. 774-779.
(Continued)

*Primary Examiner* — Jermele M Hollington
*Assistant Examiner* — Raul Rios Russo
(74) *Attorney, Agent, or Firm* — Murphy, Bilak & Homiller, PLLC (57) ABSTRACT

A method of sensing current flowing in a power module is provided. The module includes a first substrate having a metallized side, a second substrate spaced apart from the first substrate and having a metallized side facing the metallized side of the first substrate, and a semiconductor die interposed between the first and second substrates. The semiconductor die has a first side connected to the metallized side of the first substrate and an opposing second side connected to the metallized side of the second substrate. The module further includes a sensor connected to the metallized side of the first substrate and galvanically isolated from the metallized side of the second substrate. The sensor is aligned with a first metal region of the metallized side of the second substrate, for measuring a magnetic field generated by the
(Continued)

first metal region responsive to the current flowing through the first metal region.

20 Claims, 7 Drawing Sheets (51) Int. Cl.
G01R 19/00 (2006.01)
H01L 43/04 (2006.01)
H01L 23/498 (2006.01)
H01L 23/40 (2006.01)
H01L 25/18 (2006.01)

(52) U.S. Cl.
CPC .. *H01L 23/49811* (2013.01); *H01L 23/49833* (2013.01); *H01L 23/49838* (2013.01); *H01L 25/18* (2013.01); *H01L 43/04* (2013.01)

(58) Field of Classification Search
USPC ....... 324/323, 327, 329, 330, 332–334, 338, 324/346, 351
See application file for complete search history.

(56) References Cited

U.S. PATENT DOCUMENTS

| | | |
|---|---|---|
| 2004/0217451 A1 | 11/2004 | Lee et al. |
| 2006/0226826 A1 | 10/2006 | Teppan |
| 2007/0290337 A1 | 12/2007 | Otremba et al. |
| 2010/0232220 A1* | 9/2010 | Meade ............... G11C 11/16 365/171 |
| 2011/0304327 A1* | 12/2011 | Ausserlechner ..... G01R 15/207 324/239 |
| 2012/0267730 A1 | 10/2012 | Renard et al. |
| 2013/0105961 A1 | 5/2013 | Jones et al. |
| 2013/0307156 A1 | 11/2013 | Bayerer |

OTHER PUBLICATIONS

Unknown, Author, "Current Sensing Using Linear Hall Sensors", Application Note, Rev. 1.1, Infineon Technologies AG, Feb. 3, 2009, pp. 1-18.

Unknown, Author, "Dynamic Differential Hall Effect Sensor IC (TLE 4923)", Data Sheet, Infineon Technologies AG, Jul. 1, 2000, pp. 1-19.

\* cited by examiner

METHOD OF SENSING CURRENT FLOWING IN A POWER MODULE

TECHNICAL FIELD

The instant application relates to power modules, and more particularly to power modules with integrated current sensors.

BACKGROUND

The integration of magnetoresistive or Hall sensors in a power module for measuring load current presents several challenges. For example, the sensor must be placed in the correct position to achieve the necessary accuracy. In the case of a differential Hall sensor, both Hall plates of the sensor must be located on sides of the current rail that generate the magnetic field being measured. Also, magnetoresistive and Hall sensors must be galvanically isolated from other components of the module. Galvanic isolation is conventionally achieved by adding an additional ceramic structure to the power module. Such a construction presents a high complexity in the production of a power module. The attachment between the underlying module substrate and the ceramic isolating structure for the sensor must be very robust to fulfill reliability requirements such as thermal shock, thermal cycling, and power cycling.

SUMMARY

According to an embodiment of a power module, the power module comprises a first substrate having a metallized side, a second substrate spaced apart from the first substrate and having a metallized side facing the metallized side of the first substrate, and a semiconductor die interposed between the first and second substrates. The semiconductor die has a first side connected to the metallized side of the first substrate and an opposing second side connected to the metallized side of the second substrate. The power module further comprises a sensor connected to the metallized side of the first substrate and galvanically isolated from the metallized side of the second substrate. The sensor is aligned with a first metal region of the metallized side of the second substrate so that the sensor can measure a magnetic field generated by the first metal region.

According to an embodiment of a method of manufacturing the power module, the method comprises: attaching the first side of the semiconductor die to the metallized side of the first substrate and the opposing second side of the semiconductor die to the metallized side of the second substrate with the semiconductor die interposed between the first and second substrates, and attaching the sensor to the metallized side of the first substrate so that the sensor is galvanically isolated from the metallized side of the second substrate and aligned with a first metal region of the metallized side of the second substrate.

According to an embodiment of sensing current flowing in the power module, the method comprising: switching the semiconductor die so that current flows in a first metal region of the metallized side of the second substrate aligned with the sensor, the current flowing in the first metal region corresponding to the current flowing through the semiconductor die during switching; sensing, by the sensor, a magnetic field generated by the first metal region responsive to the current flowing through the first metal region; and generating a signal corresponding to the magnetic field sensed by the sensor.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, a galvanically isolated sensor is integrated into a power module with double-sided cooling without the addition of a further isolating structure for the sensor. For example, the sensor can be interposed between two ceramic substrates, each having opposing metallized sides. Such a module construction offers a double-sided thermal pathway for dissipating heat produced by the losses in each switch included in the module, reducing the thermal resistance of the module and therefore increasing the performance of the module (e.g. maximum power and power density). The sensor can be placed on either ceramic substrate and the current rail sensed by the sensor is placed on the opposite substrate. The sensor is spaced apart from the current rail to ensure sufficient galvanic isolation. A metal block such as a clip can be used to adjust the distance between the current rail and the sensor.

Figure 1:
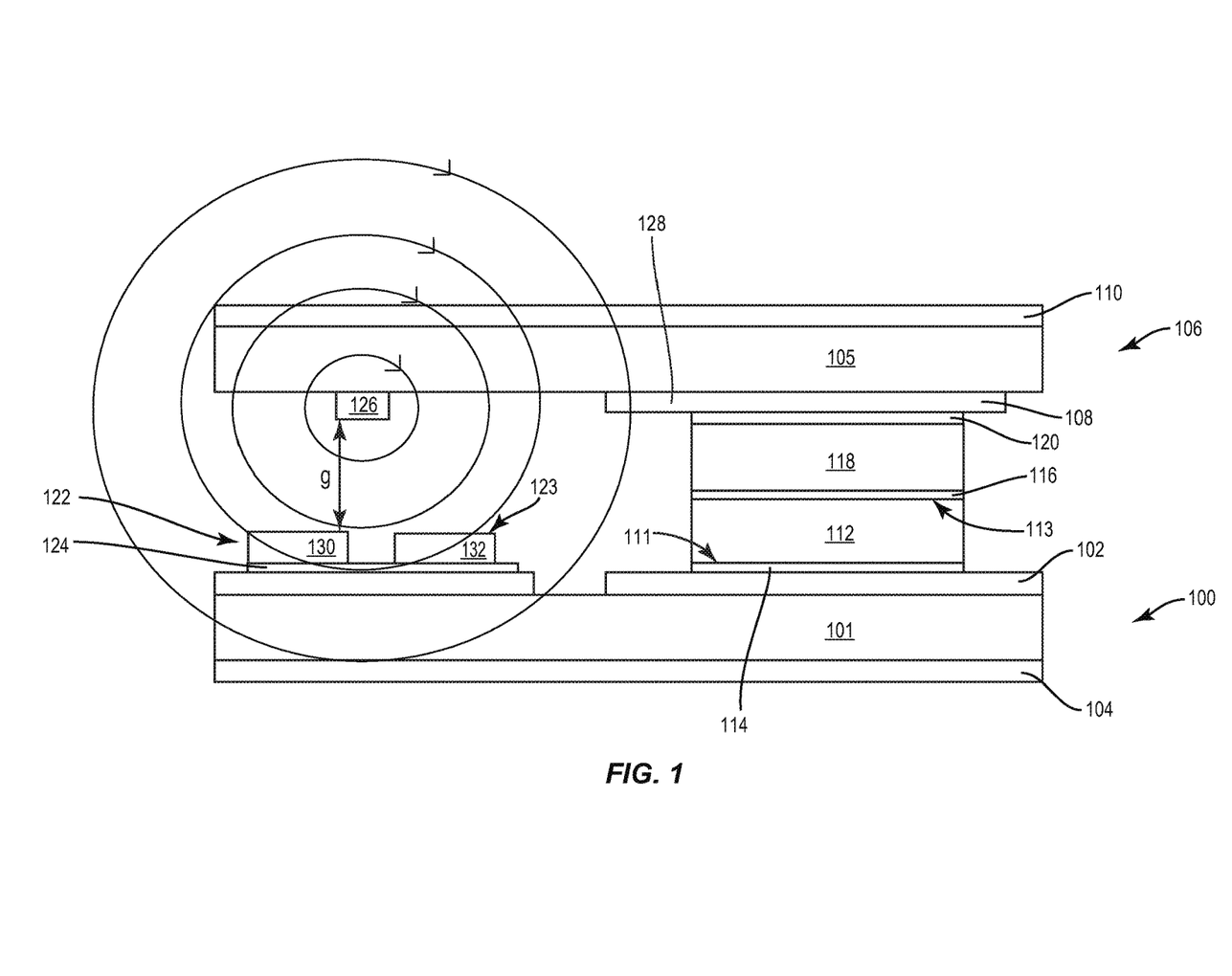
FIG. 1 illustrates a cross-sectional view of an embodiment of a power module with an integrated current sensor.

FIG. 1 illustrates a cross-sectional view of an embodiment of a power module. The power module includes a lower substrate 100 comprising an electrical isolation material 101 such as a ceramic having opposing metallized sides 102, 104, and an upper substrate 106 spaced apart from the lower substrate 100 and also comprising an electrical isolation material 105 such as a ceramic having opposing metallized sides 108, 110. The top metallized side 102 of the lower substrate 100 faces the bottom metallized side 108 of the upper substrate 106. One or more semiconductor dies 112 are interposed between the lower and upper substrates 100, 106. The semiconductor die 112 in view in FIG. 1 has a bottom side 111 connected to the top metallized side 102 of the lower substrate 100 and an opposing top side 113 connected to the bottom metallized side 108 of the upper substrate 106. Respective solder or sintered die attach layers 114, 116 can be used for these connections. According to this embodiment, the top side 113 of the semiconductor die 112 is connected to the bottom metallized side 108 of the upper substrate 106 by a metal block 118 such as a copper clip interposed between the semiconductor die 112 and the upper substrate 106. The metal block 118 can be joined to the bottom metallized side 108 of the upper substrate 106 by an additional solder or sintered attach layers 120.

A sensor 122 is connected to the top metallized side 102 of the lower substrate 100. A solder or sintered die attach layer 124 can be used for this connection. The top metallized side 102 of the lower substrate 100 and the bottom metallized side 108 of the upper substrate 106 are both patterned so that proper electrical connections can be made to the sensor 122 and semiconductor die 112. The bottom metallized side 104 of the lower substrate 100 and/or the top metallized side 110 of the upper substrate 106 can be of a single continuous construction to reduce the thermal resistance of the module. Heat sinks can be attached to either or both of these metallized sides 104, 110 to increase the thermal performance of the module. Such heat sinks are not shown in FIG. 1 for ease of illustration.

The sensor 122 interposed between the lower and upper substrates 100, 106 is galvanically isolated from the substrate to which the sensor 122 is not attached. In the embodiment illustrated in FIG. 1, the sensor 122 is attached to the lower substrate 100 and galvanically isolated from the bottom metallized side 108 of the upper substrate 106 by a gap (g) between the top side 123 of the sensor 122 and the bottom metallized side 108 of the upper substrate 106. The sensor 122 is aligned with a first metal region 126 of the bottom metallized side 108 of the upper substrate 106. In this embodiment, the sensor 122 is positioned under the first metal region 126. However, the sensor 122 instead can be positioned over the first metal region 126 in the case of the sensor 122 being attached to the upper substrate 106 and the first metal region 126 being disposed at the top metallized side 102 of the lower substrate 100. In either case, this metal region 126 is also referred to herein as current rail.

The top side 113 of the semiconductor die 112 is electrically connected to a second metal region 128 of the bottom metallized side 108 of the upper substrate 106. The second metal region 128 of the bottom metallized side 108 of the upper substrate 106 can be connected to the current rail 126 so that current flowing in the rail 126 passes through the semiconductor die 112 during operation of the die 112. As such, current flowing in the rail 126 aligned with the sensor 1122 is proportional to the module current. The current rail 126 generates a magnetic field based on the current flowing in the rail 126. The magnetic field is schematically illustrated in FIG. 1 by a series of concentric circles of increasing size.

Current in the rail 126 flows into the page in the example given in FIG. 1, and the magnetic field is generated around the rail 126 in a clockwise direction. The sensor 122 measures the magnetic field generated by the current rail 126. In the case of a differential Hall sensor 122 with two Hall plates 130, 132, the sensor 122 generates a signal which is a linear function of the differential flux density of the magnetic field passing through the Hall plates 130, 132. For applications with low noise, a Hall sensor 122 with a single Hall plate can be used. In yet another embodiment, the sensor 122 can be a magnetoresistive-based sensor such as an AMR (anisotropic magnetoresistive) sensor where the sensitive axis lies in the plane of the sensor element and the AMR sensor 122 measures the magnetic field generated by the current rail 126.

In general, any sensor 122 can be used which is galvanically isolated from one of the substrates 100, 106 and measures the magnetic field generated by a current rail 126 disposed at that substrate 100, 106. Current flowing in the power module can be sensed by switching the semiconductor die 112 so that current flows in the current rail 126 aligned with the sensor 122, the rail current corresponding to the current flowing through the semiconductor die 112 during switching. The corresponding magnetic field generated by the current rail 126 is sensed by the galvanically-isolated sensor 122. The sensor 122 generates a signal corresponding to the magnitude of the sensed magnetic field. The construction and operation of magnetoresistive and Hall sensors are well known, and therefore no further explanation is provided in this regard with regard to the sensor 122.

Figure 2:
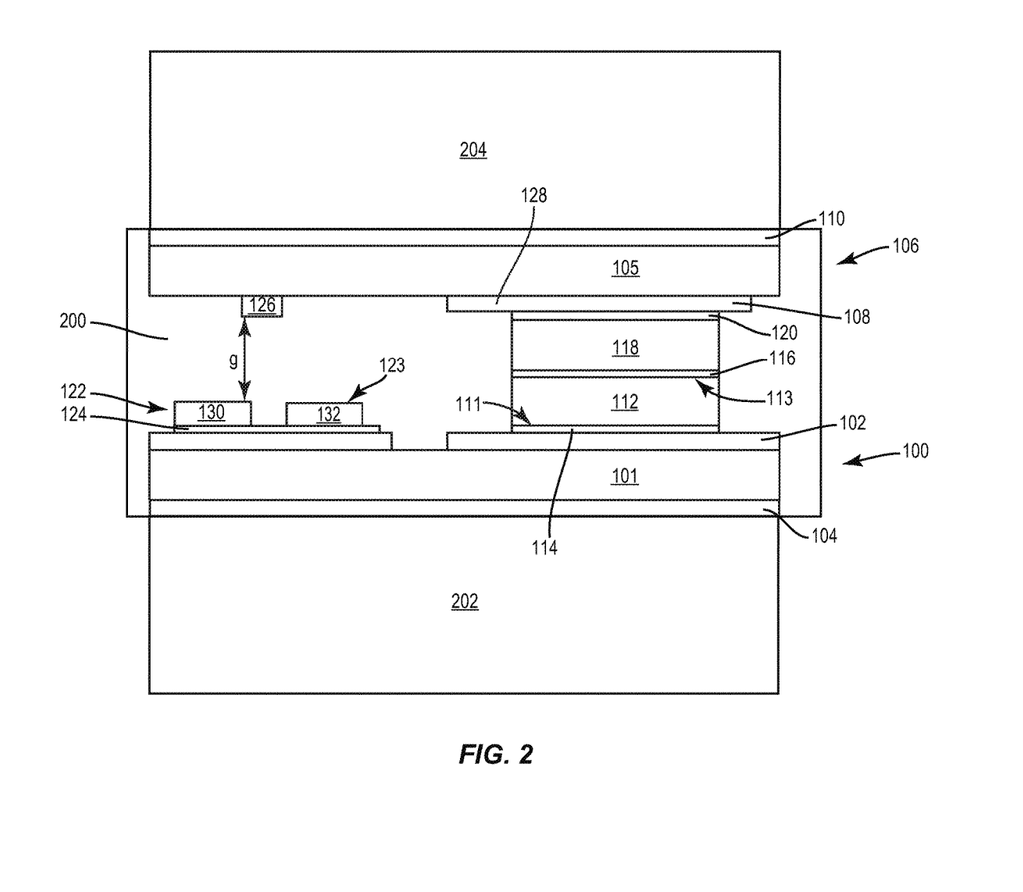
FIG. 2 illustrates a cross-sectional view of an embodiment of a power module with an integrated current sensor, a mold compound and heat sinks.

FIG. 2 illustrates a cross-sectional view of another embodiment of a power module. The module shown in FIG. 2 is similar to the one shown in FIG. 1, however, a mold compound 200 encapsulates the lower and upper substrates 100, 106, the semiconductor die 112 and the sensor 122. The bottom metallized side 104 of the lower substrate 100 and the top metallized side 110 of the upper substrate 106 remain uncovered by the mold compound 200 at opposing sides of the power module, enabling double-sided cooling. A heat sink 202, 204 can be attached, e.g., by screws, glue, etc. to the exposed bottom metallized side 104 of the lower substrate 100 and/or to the top metallized side 110 of the upper substrate 106 to increase the thermal efficiency of the module.

Figure 3:
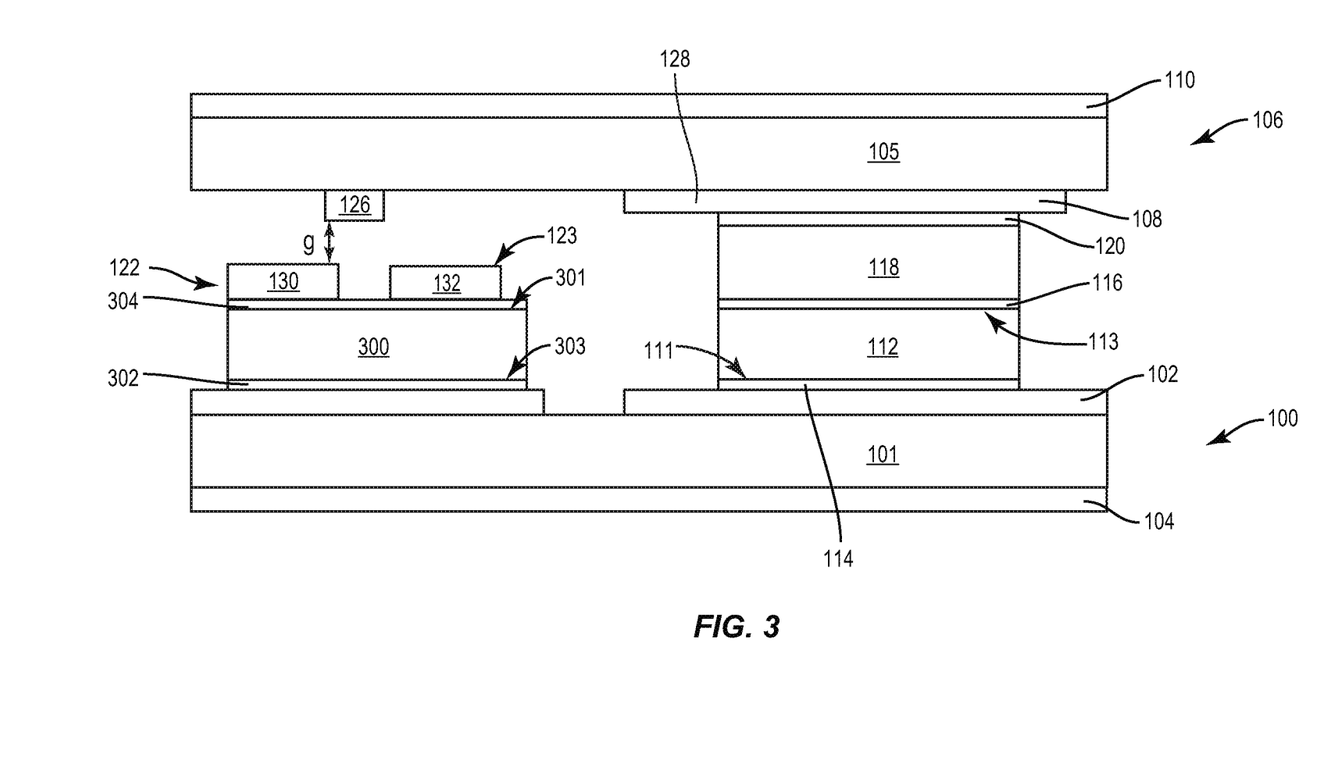
FIG. 3 illustrates a cross-sectional view of another embodiment of a power module with an integrated current sensor.

FIG. 3 illustrates a cross-sectional view of yet another embodiment of a power module. The module shown in FIG. 3 is similar to the one shown in FIG. 1, however, the sensor 122 is connected to the top side 102 of the lower substrate 100 by a metal block 300, such as a copper clip interposed between the sensor 122 and the lower substrate 100. Soldered or sintered attach layers 302, 304 are provided at the top and bottom sides 301, 303 of the metal block 300 to attach the sensor 122 to the block 300 and the block 300 to the lower substrate 100. According to this embodiment, the gap (g) between the sensor 122 and the current rail 126 disposed at the bottom metallized side 108 of the upper substrate 106 is reduced by using the metal block 300 to connect the sensor 122 to the lower substrate 100.

Figure 4:
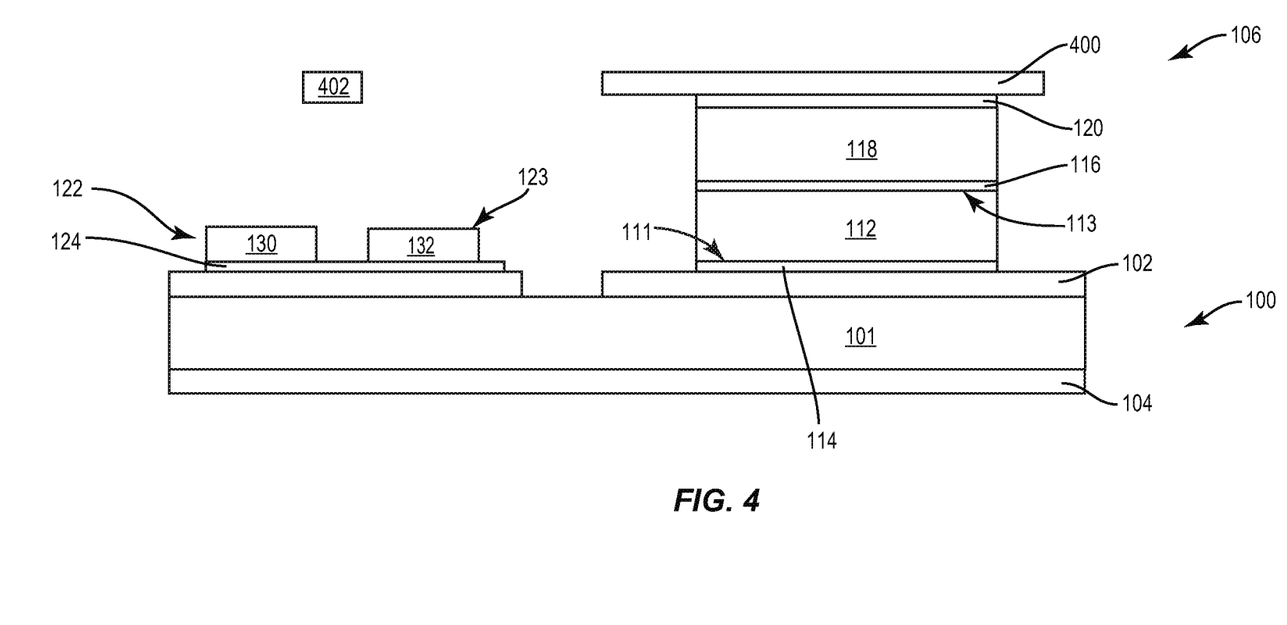
FIG. 4 illustrates a cross-sectional view of yet another embodiment of a power module with an integrated current sensor.

FIG. 4 illustrates a cross-sectional view of still another embodiment of a power module. The module shown in FIG. 4 is similar to the one shown in FIG. 1, however, the upper substrate 100 comprises a first metal clip 400 connected to the top side 113 of the semiconductor die 112 via metal block 118 and a second metal clip 402 aligned with and galvanically isolated from the sensor 122. The second metal clip 402 is a current rail which generates a magnetic field sensed by the galvanically isolated sensor 122.

Figure 5:
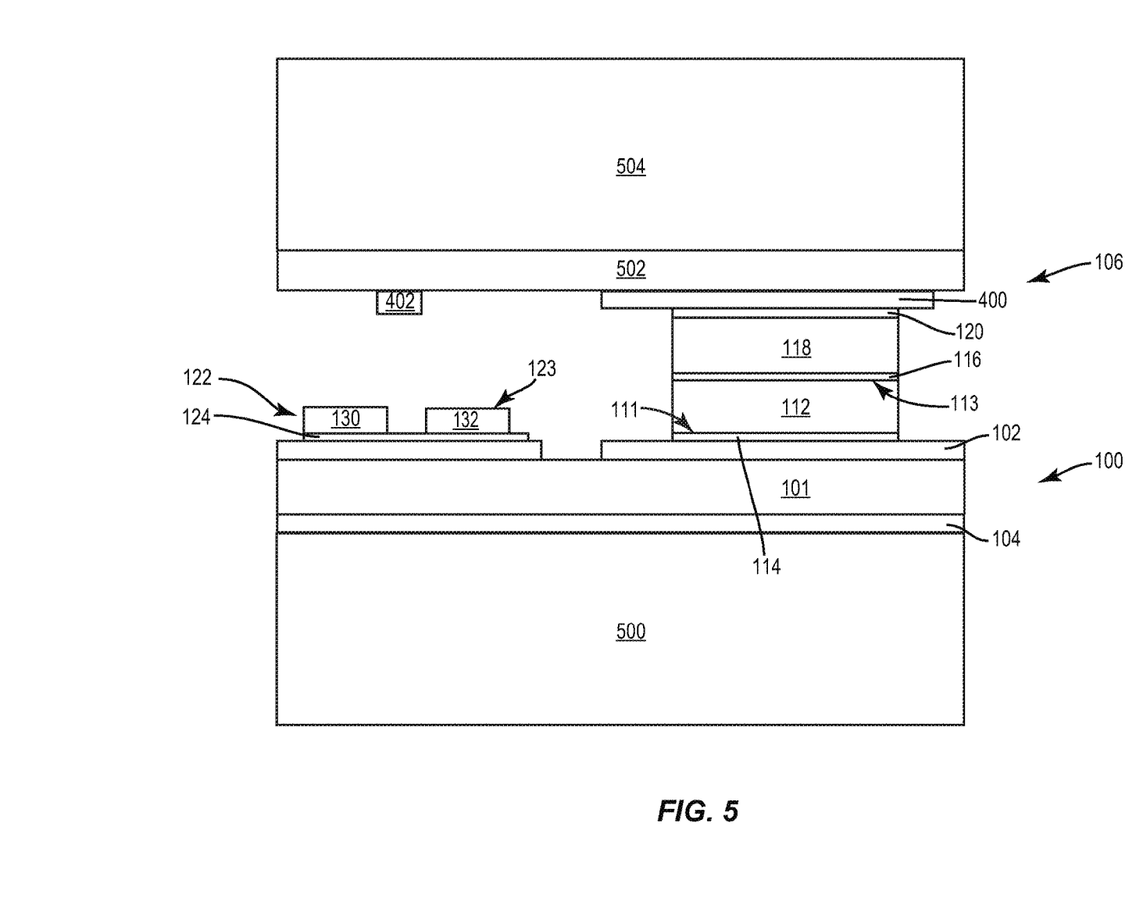
FIG. 5 illustrates a cross-sectional view of an embodiment of a power module with an integrated current sensor and heat sinks.

FIG. 5 illustrates a cross-sectional view of the power module shown in FIG. 4, with a heat sink 500 attached to the metallized bottom side 104 of the lower substrate 100. An electrical isolation material 502 such as a ceramic substrate can be attached to the metallization 400 of the upper substrate 106 so that a second heat sink 504 can be attached to the electrical isolation material 502. The module can be cooled more efficiently at both sides according to this embodiment.

Figure 6A:
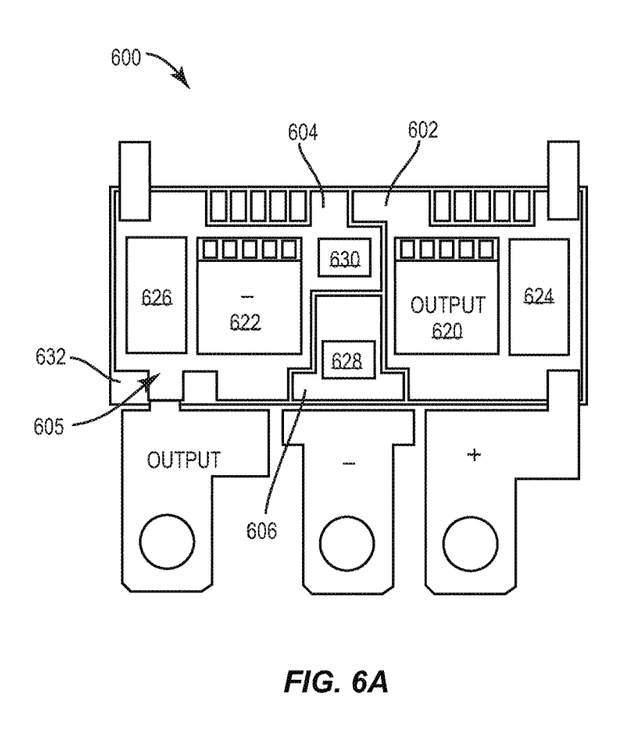
FIGS. 6A and 6B illustrate respective plan views of an embodiment of lower and upper substrates with distinct conductive regions for use in a power module with an integrated current sensor.
Figure 6B:
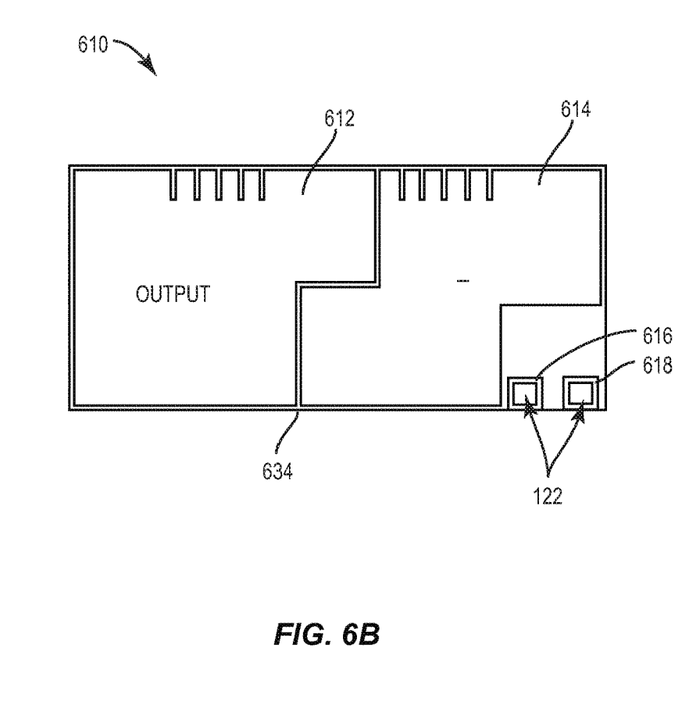
Figure 7:
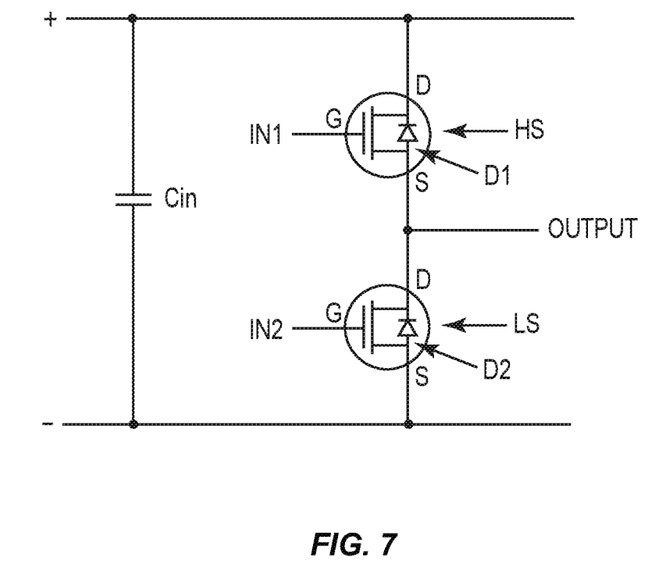
FIG. 7 illustrates an exemplary circuit diagram of a half-bridge converter circuit realized by the components included in the package realized by the lower and upper substrates of FIGS. 6A and 6B.

FIG. 6A illustrates a plan view of an embodiment of a lower substrate 600 included in a power module, and FIG. 6B illustrates a plan view of an embodiment of the corresponding upper substrate 610 included in the same power module. The lower and upper substrates 600, 610 each comprise a plurality of distinct conductive regions 602, 604, 606/612, 614, 616, 618. According to this embodiment, the module includes at least two semiconductor dies 620, 622 and corresponding free-wheeling diodes 624, 626 for each die 620, 622. In one example, the dies 620,622 form a half-bridge circuit with a high-side switch (HS), low-side switch (LS), free-wheeling diodes D1, D2 for each switch, and an input capacitor (Cin) as schematically illustrated in FIG. 7. Other circuit types may be employed such as a multi-phase switch, three-phase inverter, etc.

The bottom side of the high-side switch die 620 and the corresponding free-wheeling diode 624 are connected to a first conductive region 602 of the lower substrate 600. The bottom side of the low-side switch die 622 and the corresponding free-wheeling diode 626 are connected to a second conductive region 604 of the lower substrate 600. The output terminal (output) of the half-bridge circuit is connected to the second conductive region 604 of the lower substrate 600.

In the case of power MOSFETs (metal oxide semiconductor field effect transistors), the drain (D) of the high-side switch die 620 is connected to the positive terminal (+) of the half-bridge circuit and the source (S) of the low-side switch die 622 is connected to the negative terminal (−) of the half-bridge circuit. In the case of IGBTs (insulated gate bipolar transistors), the collector of the high-side switch die 620 is connected to the positive terminal (+) of the half-bridge circuit and the emitter of the low-side switch die 622 is connected to the negative terminal (−) of the half-bridge circuit. The lower substrate 600 has a third distinct conductive region 606 connected the negative terminal (−) of the module. Wire bonds, ribbons and/or metal clips can be used to form the electrical connections between the dies 620, 622, diodes 624, 626 and terminals (+, −, output) as schematically indicated in FIG. 7. These connections and terminals, including the input capacitor (Cin), the gate (G) connections and input signals (IN1, IN2) are not shown in FIGS. 6A and 6B for ease of illustration, but are schematically illustrated in FIG. 7.

The second conductive region 604 of the lower substrate 600 narrows at the point of connection with the output terminal (output) of the module. The narrowed part 605 of the second conductive region 604 forms the current rail which generates a magnetic field responsive to current flowing through the switch dies 620, 622. Because the sensor 122 must be properly aligned with and galvanically isolated from the current rail 605, the sensor 122 is attached to one or more conductive regions 616, 618 of the upper substrate 610 so that the sensor 122 is positioned over the current rail 605 upon assembly of the module. The side of the upper substrate 610 shown in FIG. 6B is flipped and rotated to align properly with the switch dies 620, 622 and the lower substrate 600, including proper alignment of the sensor 122 with the current rail 605.

In FIG. 6B, the sensor 122 is illustrated as a differential Hall sensor with two Hall plates each aligned with the underlying current rail 605 so that the sensor 122 can measure the differential flux density of the magnetic field generated by the current rail 605 when current is flowing through the rail 605. The source (emitter) terminal of the low-side switch die 622 is connected to the negative terminal (−) of the half-bridge circuit by a metal block 628 such as a copper clip which shorts the conductive region 606 of the lower substrate 600 connected to the negative terminal (−) of the module to the corresponding conductive region 614 of the upper substrate 610. The drain (collector) terminal of the high-side switch die 620 is similarly connected to the output terminal (output) of the half-bridge circuit by a metal block 630 such as a copper clip which shorts the conductive region 612 of the upper substrate 610 connected to the drain (collector) of the high-side switch die 620 to the conductive region 604 of the lower substrate 600 connected to the output terminal (output) of the module. The conductive regions 602, 604, 606 of the lower substrate 600 and the conductive regions 612, 614, 616, 618 of the upper substrate 610 can be attached to corresponding electrical isolation materials 632, 634 such as respective ceramic substrates each having a metallized exterior side, for providing double-sided cooling as previously described herein. Such an arrangement can further include a heat sink attached to the exterior metallized side of one or both isolation materials 632, 634, and/or a mold compound encapsulating the module also as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc., and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of sensing current flowing in a power module comprising a first substrate having a metallized side, a second substrate spaced apart from the first substrate and having a metallized side facing the metallized side of the first substrate, a semiconductor die interposed between the first and second substrates, the semiconductor die having a first side connected to the metallized side of the first substrate and an opposing second side connected to the metallized side of the second substrate, and a sensor connected to the metallized side of the first substrate and galvanically isolated from the metallized side of the second substrate, the method comprising:

switching the semiconductor die so that current flows in a first metal region of the metallized side of the second substrate aligned with the sensor, the current flowing in the first metal region corresponding to the current flowing through the semiconductor die during switching;

sensing, by the sensor, a magnetic field generated by the first metal region responsive to the current flowing through the first metal region; and generating a signal corresponding to the magnetic field sensed by the sensor.

2. The method of claim 1, wherein the second side of the semiconductor die is electrically connected to a second metal region of the metallized side of the second substrate, and wherein the second metal region is connected to the first metal region.

3. The method of claim 1, wherein the first substrate comprises a plurality of conductive regions, wherein the first side of the semiconductor die is connected to one of the conductive regions, and wherein the sensor is connected to one or more different ones of the conductive regions that the semiconductor die.

4. The method of claim 3, wherein the power module further comprises an electrical isolation material having a first side attached to a side of the conductive region facing away from the semiconductor die, and a second side opposing the first side, and a heat sink attached to the second side of the electrical isolation material.

5. The method of claim 1, wherein the first substrate comprises an electrical isolation material with a metallized first side and an opposing metallized second side, and wherein the first side of the semiconductor die and the sensor are connected to the first metallized side of the electrical isolation material.

6. The method of claim 5, wherein the second substrate comprises an electrical isolation material with a metallized first side facing the first substrate and an opposing metallized second side, wherein the second side of the semiconductor die is connected to the first metallized side of the electrical isolation material of the second substrate, and wherein the sensor is galvanically isolated from the first metallized side of the electrical isolation material of the second substrate.

7. The method of claim 6, wherein the second side of the semiconductor die is connected to the first metallized side of the electrical isolation material of the second substrate by a metal block interposed between the semiconductor die and the second substrate.

8. The method of claim 6, wherein the second metallized side of the electrical isolation material of the second substrate is of a single continuous construction.

9. The method of claim 6, wherein the power module further comprises a first heat sink attached to the second metallized side of the electrical isolation material of the first substrate and a second heat sink attached to the second metallized side of the electrical isolation material of the second substrate.

10. The method of claim 6, wherein the power module further comprises a mold compound encapsulating the first and second substrates, the semiconductor die and the sensor, and wherein the second metallized side of the electrical isolation material of the first substrate and the second metallized side of the electrical isolation material of the second substrate remain uncovered by the mold compound at opposing sides of the method.

11. The method of claim 1, wherein the second substrate comprises a first metal clip connected to the second side of the semiconductor die and a second metal clip under which the sensor is aligned and galvanically isolated.

12. The method of claim 1, wherein the sensor is connected to the metallized side of the first substrate by a metal block interposed between the sensor and the first substrate.

13. The method of claim 1, wherein the sensor is a differential Hall sensor comprising two Hall plates, each Hall plate positioned in the same plane and aligned with the first metal region of the second substrate so that the magnetic field generated by the first metal region intersects both Hall plates.

14. The method of claim 13, wherein generating the signal corresponding to the magnetic field sensed by the sensor comprises generating a signal which is a linear function of the differential flux density of the magnetic field passing through the two Hall plates.

15. The method of claim 1, wherein the sensor comprises a single Hall plate, and wherein generating the signal corresponding to the magnetic field sensed by the sensor comprises generating a signal which is a linear function of the flux density of the magnetic field passing through the single Hall plate.

16. A method of sensing current flowing in a power module comprising a first substrate having a plurality of distinct conductive regions, a second substrate spaced apart from the first substrate and having a plurality of distinct conductive regions facing the plurality of distinct conductive regions of the first substrate, a high-side switch die connected to a first conductive region of the first substrate, a low-side switch die connected to a second conductive region of the first substrate, an output terminal connected to the second conductive region of the first substrate, and a sensor connected to a first conductive region of the second substrate and galvanically isolated from the second conductive region of the first substrate and the output terminal, wherein the high-side switch die and the low-side switch die are connected in a half-bridge configuration, wherein the second conductive region of the first substrate narrows at a point of connection with the output terminal, wherein the sensor is aligned with the narrow part of the second conductive region of the first substrate, the method comprising:
  switching the high-side switch die and the low-side switch die such that current flows in the narrow part of the second conductive region of the first substrate;
  sensing, by the sensor, a magnetic field generated by the narrow part of the second conductive region of the first substrate responsive to the current flowing through the narrow part; and
  generating a signal corresponding to the magnetic field sensed by the sensor.

17. The method of claim 16, wherein the sensor is a differential Hall sensor comprising two Hall plates, each Hall plate aligned with the narrow part of the second conductive region of the first substrate so that the magnetic field generated by the narrow part of the second conductive region of the first substrate intersects both Hall plates.

18. The method of claim 17, wherein generating the signal corresponding to the magnetic field sensed by the sensor comprises generating a signal which is a linear function of the differential flux density of the magnetic field passing through the two Hall plates.

19. A method of sensing current flowing in a power module comprising a first substrate having a plurality of distinct conductive regions, a second substrate spaced apart from the first substrate and having a plurality of distinct conductive regions facing the plurality of distinct conductive regions of the first substrate, an output terminal connected to a first conductive region of the first substrate, and a sensor connected to a first conductive region of the second substrate and galvanically isolated from the first conductive region of the first substrate and the output terminal, wherein the first conductive region of the first substrate narrows at a point of connection with the output terminal, wherein the sensor is aligned with the narrow part of the first conductive region of the first substrate, the method comprising:
  forcing current to flow in the narrow part of the first conductive region of the first substrate;

sensing, by the sensor, a magnetic field generated by the narrow part of the first conductive region of the first substrate responsive to the current flowing through the narrow part; and generating a signal corresponding to the magnetic field sensed by the sensor.

20. The method of claim 19, wherein the sensor is a differential Hall sensor comprising two Hall plates, each Hall plate aligned with the narrow part of the second conductive region of the first substrate so that the magnetic field generated by the narrow part of the second conductive region of the first substrate intersects both Hall plates, and wherein generating the signal corresponding to the magnetic field sensed by the sensor comprises generating a signal which is a linear function of the differential flux density of the magnetic field passing through the two Hall plates.

* * * * *